United States Patent [19]

Neilson et al.

[11] Patent Number: 5,455,442
[45] Date of Patent: Oct. 3, 1995

[54] COMFET SWITCH AND METHOD

[75] Inventors: John M. S. Neilson, Norristown; Wolfgang F. W. Dietz, New Hope, both of Pa.

[73] Assignee: Harris Corporation, Melbourne, Fla.

[21] Appl. No.: 375,714

[22] Filed: Jan. 20, 1995

Related U.S. Application Data

[63] Continuation of Ser. No. 153,907, Nov. 17, 1993, abandoned.

[51] Int. Cl.[6] .................................................. H01L 29/68
[52] U.S. Cl. .......................... 257/124; 257/133; 257/139; 257/144; 257/152; 257/212; 257/341; 257/342; 257/401; 257/773; 257/784
[58] Field of Search ..................... 257/139, 124, 257/140, 141, 144, 341, 342, 401, 498, 133, 152, 212, 773, 784

[56] References Cited

U.S. PATENT DOCUMENTS

| | | | |
|---|---|---|---|
| 4,689,647 | 8/1987 | Nakagawa et al. | 257/140 |
| 4,985,743 | 1/1991 | Tokura et al. | 257/140 |
| 5,170,239 | 12/1992 | Hagino | 257/139 |

*Primary Examiner*—Edward Wojciechowicz
*Attorney, Agent, or Firm*—Rogers & Killeen

[57] ABSTRACT

The performance of COMFET-based electrical switches may be improved by connecting a MOSFET substantially in parallel with the COMFET. In a monolithic embodiment, a MOSFET drain region may be added to a surface of a COMFET and shorted to the emitter region of the COMFET. The invention decreases the turn-off time of the COMFET, reduces the discontinuity at current direction reversal and increases the latch-up current of a semiconductor switch.

16 Claims, 5 Drawing Sheets

COMFET SWITCH AND METHOD

This is a continuation of application Ser. No. 08/153,907, filed Nov. 17, 1993 now abandoned.

BACKGROUND OF THE INVENTION

The present invention relates to electrical switch circuits and, more particularly, to methods and devices for decreasing the turn-on time in electrical switches that include one or more conductivity modulated field effect transistors (COMFETs) through the innovative use of metal oxide semiconductor field effect transistors (MOSFETs).

With reference to FIG. 1, MOSFETs are voltage driven devices 10 with a gate G that is electrically isolated from the device's silicon body 12 by a thin layer of silicon dioxide ($SiO_2$) 14. MOSFETs are majority carrier semiconductors that operate at much higher speeds than bipolar transistors because there is no charge-storage mechanism. A positive voltage applied to the gate G of an N type MOSFET creates an electric field in the channel region 16 beneath the gate G; that is, the electric charge on the gate causes the portion of the P type body region 18 beneath the gate to convert to an N region. This conversion allows current to flow between the drain D and source S metals through an N type drain material as indicated by the dotted arrows in the figure. In effect, the MOSFET ceases to be an N-P-N device when in this state. A useful by-product of the MOSFET process is the internal parasitic diode formed between source 17 and drain 13 that is useful as a clamp diode in inductive-load switching.

With reference now to FIG. 2, COMFETs are similar in structure to MOSFETs, but the conductivity of the N type epitaxial voltage blocking layer 20 is greatly increased (modulated) by the injection of minority carriers from a P type anode 22. A COMFET is a four layer (N-P-N-P) device with a MOS-gated channel 34 connecting the two N-type regions. In the normal mode of operation, a positive voltage is applied to the drain relative to the source. When the gate is at zero potential with respect to the source, no anode current flows when the anode voltage $V_A$ is below the breakdown level $V_{BF}$. When $V_A < V_{BF}$ and the gate voltage is larger than the threshold voltage value $V_{gt}$, electrons pass into the N⁻ drain region 20 (the base of the P-N-P transistor). These electrons lower the potential of the N⁻ drain region 20, forward biasing the P⁺ N⁻ junction, thereby causing holes to be injected from the P⁺ anode 22 into the N⁻ drain region 20. The excess electrons and holes modulate the conductivity of the high resistivity N⁻ drain region, dramatically reducing the on-resistance of the device.

Since a COMFET is a four layer structure, it could latch on. That is, the device would remain conductive and the gate would be unable to control it if the sum of the alphas of the integral NPN and PNP transistors were to exceed unity. This is prevented by the shunting resistance $R_s$ formed by the source metal 24 shorting the N+ source region 26 and the P+ well body region 28. During normal operation, the shunting resistance $R_S$ keeps the emitter current of the N-P-N transistor very low, which keeps $\alpha_{NPN}$ very low. COMFETs are also known as insulated gate rectifiers (IGRs), gain enhanced field effect transistors (GEMFETs) and insulated gate transistors (IGTs). See, for example, U.S. Pat. No. 4,364,073 issued Dec. 14, 1982 to Becke, et al.

A COMFET structure may be modified to increase the latching current $I_L$ (the level of anode current when $\alpha_{NPN} + \alpha_{PNP}$ increases to 1 causing the device to latch) by the addition of a thin (about 10 microns) layer 30 (a punch-through barrier) of N⁺ silicon in the epitaxial structure between the N− drain region 20 and the P⁺ anode region 22. This layer 30 lowers the emitter injection efficiency of the P-N-P transistor equivalent circuit and results in an increase of $I_L$ by a factor of 2 to 3. In addition, there is a reduction in fall time $t_f$.

A plot of anode-to-source current $I_{AS}$ versus voltage $V_{AS}$ for various gate voltages $V_G$ in a typical COMFET is shown in FIG. 3 and the anode-to-source current $I_{AS}$ versus voltage $V_{AS}$ for gate voltages $V_G$ in a typical MOSFET is illustrated in FIG. 4. By comparing these two figures, it may be seen that, for a given gate voltage $V_G$ and a given anode-to-source voltage $V_{AS}$ above approximately one volt, the COMFET can carry more current than the MOSFET. Below about one volt $V_{AS}$ the COMFET current drops rapidly to almost zero, while the MOSFET current continues down an essentially ohmic trace. When anode-to-source voltage $V_{AS}$ goes negative, the COMFET carries almost no current while the MOSFET continues down along the same ohmic trace it had in the positive voltage. At about one negative volt $V_{AS}$, the resistance in the MOSFET drops off rapidly as current begins to flow across the forward direction of body-drain region junction 32. Thus, the MOSFET minimizes the discontinuity in voltage drop as the current through the device goes from forward to reverse, while the COMFET has the ability to carry a larger current for a given gate voltage $V_G$ and anode-to-source voltage $V_{AS}$ (above one volt).

Accordingly, it is an object of the present invention to provide a novel method and device to use a MOSFET to improve the performance of a COMFET-based electrical switch.

It is a further object of the present invention to provide a novel semiconductor switch circuit having a COMFET and MOSFET connected substantially in parallel.

It is yet a further object of the present invention to provide a novel semiconductor device in which a COMFET and MOSFET are connected substantially in parallel in a single semiconductor chip.

It is another object of the present invention to provide a novel method of decreasing the turn-off time of a COMFET by shorting the COMFET lower emitter region to remove stored charge.

It is yet another object of the present invention to provide a novel method of increasing the latch-up current of a COMFET semiconductor switch by locating a MOSFET drain region remote from the gate metal contacts of the COMFET.

These and many other objects and advantages will be readily apparent to one skilled in the art to which the invention pertains from a perusal of the claims, the appended drawings, and the following detailed description of preferred embodiments.

DETAILED DESCRIPTION OF PREFERRED EMBODIMENTS

Figure 1:
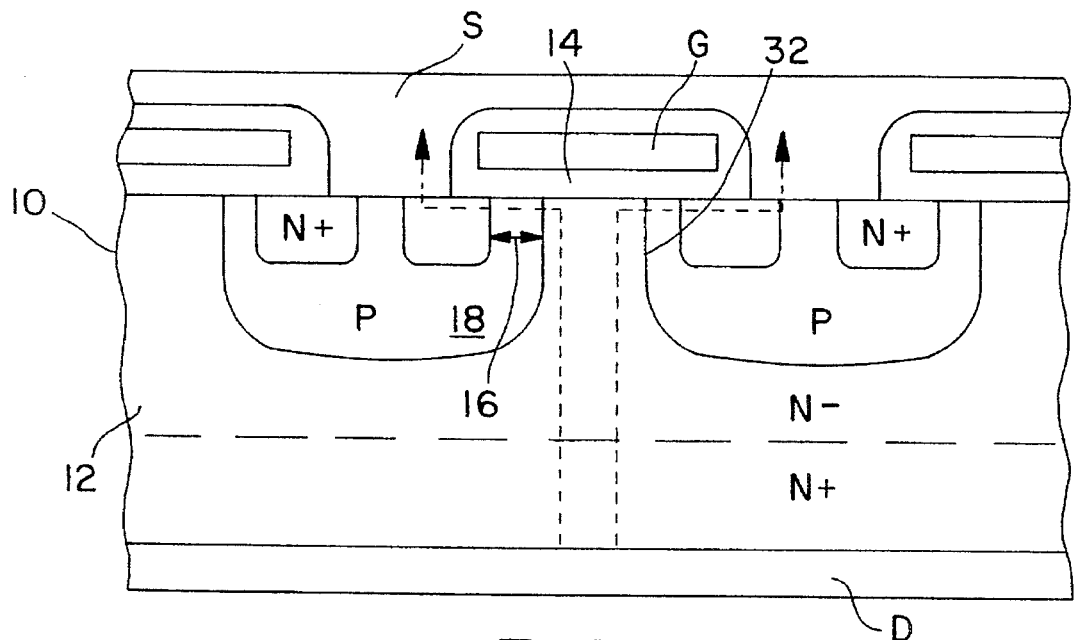
FIG. 1 is a partial pictorial representation of a vertical cross-section of a MOSFET of the prior art.
Figure 2:
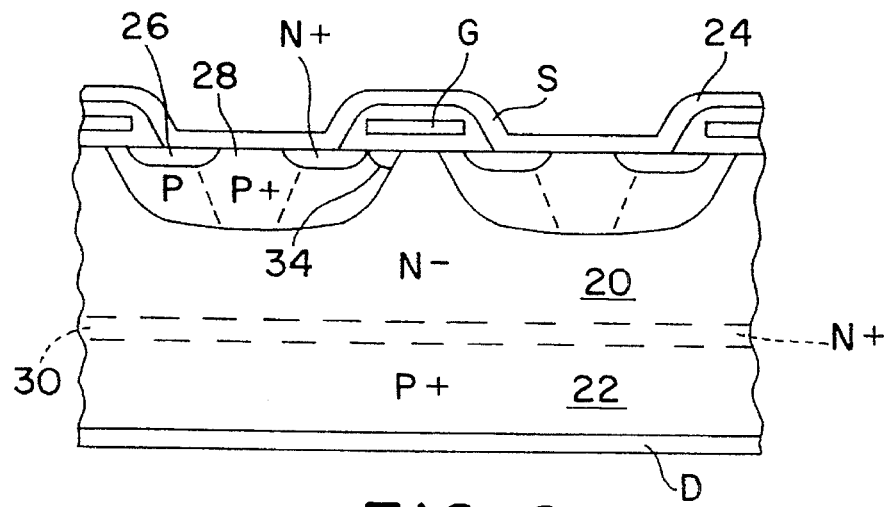
FIG. 2 is a partial pictorial representation of a vertical cross-section of a COMFET of the prior art.
Figure 3:
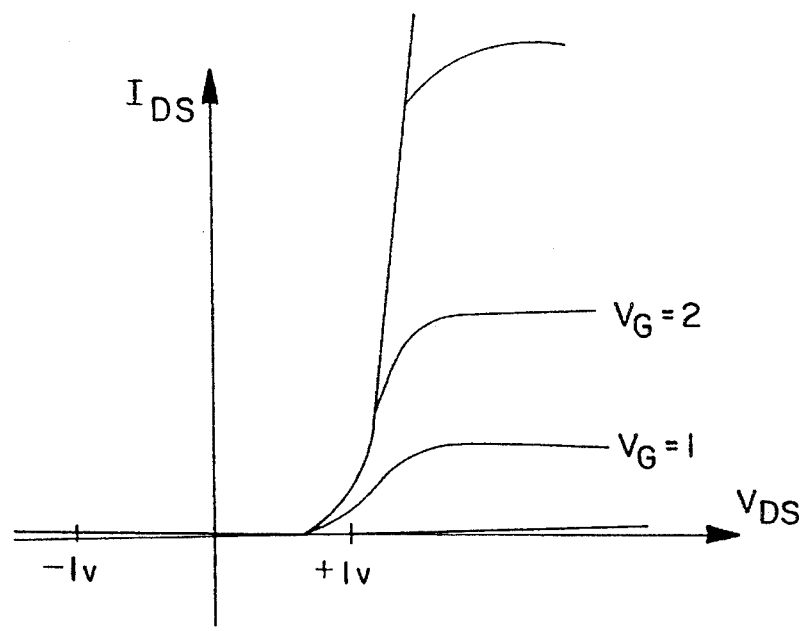
FIG. 3 is a graphical representation of the current-voltage characteristics of a typical COMFET of the prior art for various gate voltages.
Figure 4:
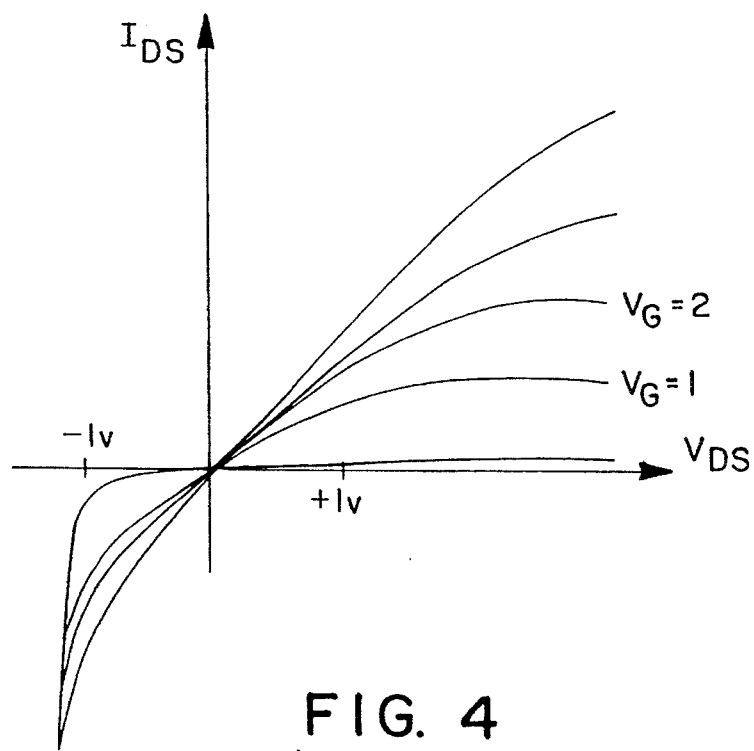
FIG. 4 is a graphical representation of the current-voltage characteristics of a typical MOSFET of the prior art for various gate voltages.
Figure 5:
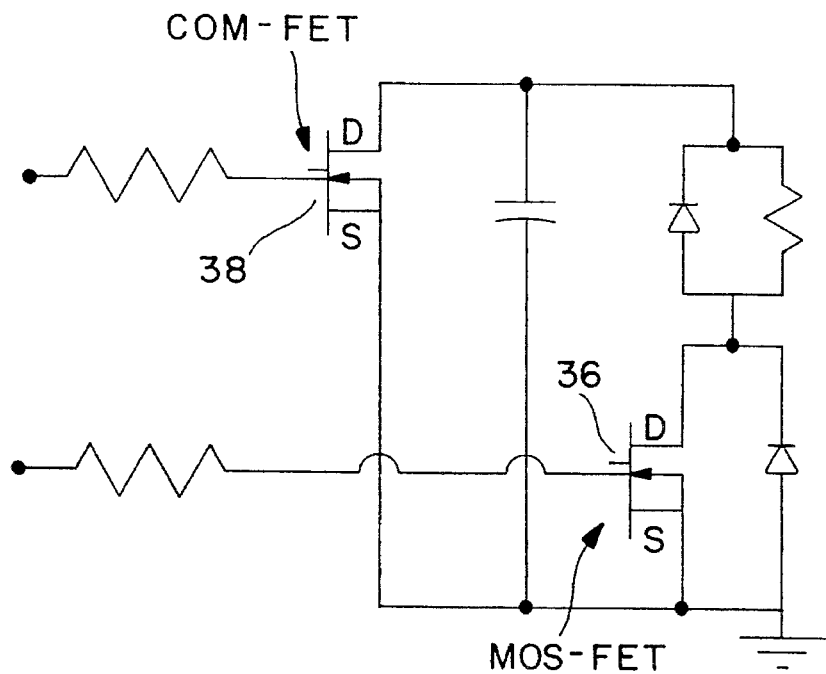
FIG. 5 is a circuit diagram of an embodiment of the present invention illustrating the COMFET and MOSFET connected substantially in parallel.
Figure 6:
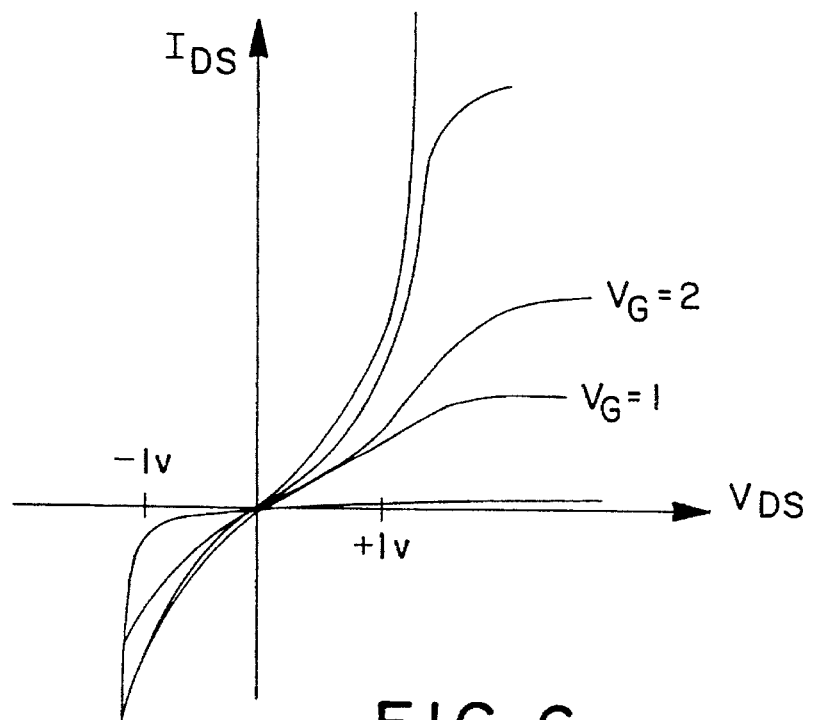
FIG. 6 is a graphical representation of the current-voltage characteristics of an embodiment of the present invention for various gate voltages.

With reference now to FIG. 5, in the method and device of the present invention, a COMFET and MOSFET are connected substantially in parallel (source-to-source, drain-to-anode and gate-to-gate). This combination provides a switching device with the desirable characteristics of both the COMFET and the MOSFET; that is, the device has the high forward current capability of the COMFET, the high reverse capability of the MOSFET, and the low resistance of the MOSFET in the region between minus one volt and plus one volt. The plot of drain/anode-to-source current $I_{AS}$ versus $V_{AS}$ voltage for gate voltages $V_G$ in an embodiment of the present invention may be seen in FIG. 6. As may be seen therein, the present invention also reduces the discontinuity in voltage drop as the current direction changes.

The present invention may include MOSFET 36 and COMFET 38 that may be separate devices connected substantially in parallel such as in the circuit shown in FIG. 5. The additional components shown in the circuit of FIG. 5 are exemplary of an application of the present invention, with other circuit configurations being apparent to those skilled in the art.

Figure 7:
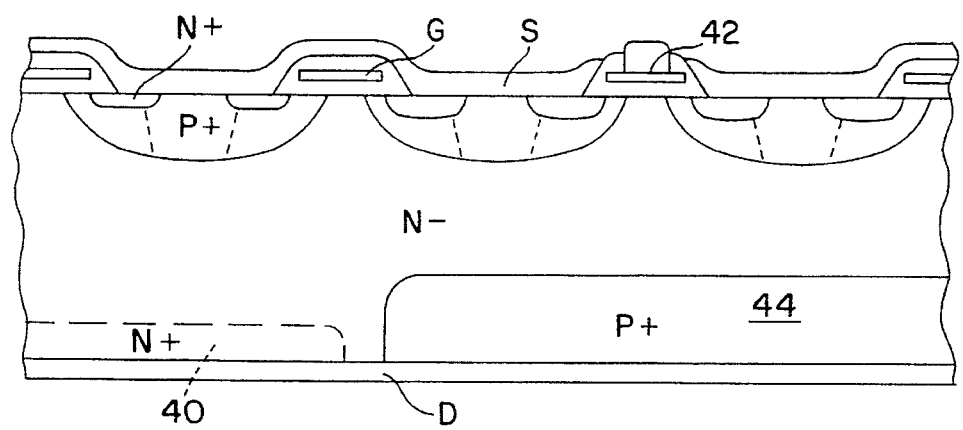
FIG. 7 is a partial pictorial representation of a vertical cross-section of an embodiment of the present invention.
Figure 8:
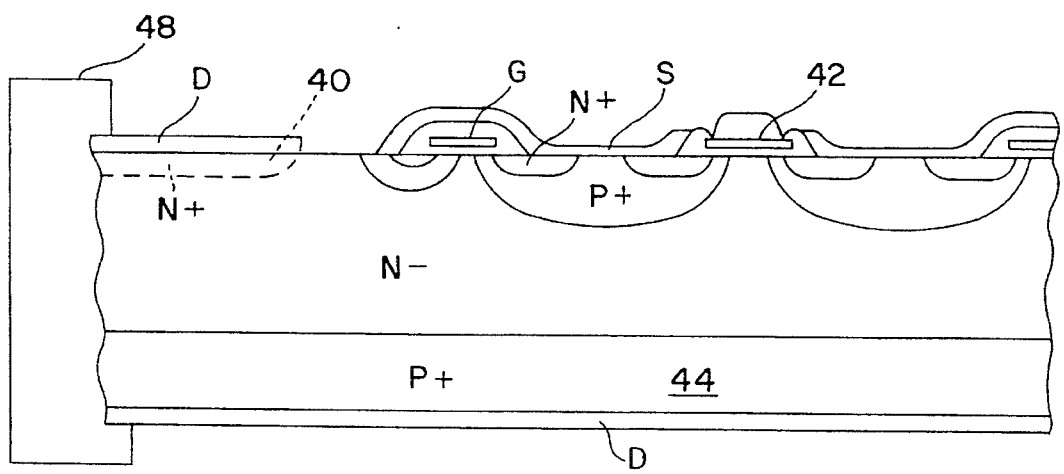
FIG. 8 is a partial pictorial representation of a vertical cross-section of a further embodiment of the present invention.

In a preferred embodiment of the present invention, the COMFET and MOSFET are combined in monolithic chip structure. As may be seen in FIGS. 7 and 8 this embodiment of the present invention begins with the gate G, source S, and anode 44 structure typical of COMFET devices (i.e., the right portions of the vertical cross-sections depicted in FIGS. 7 and 8). A MOSFET is connected substantially in parallel with the COMFET structure by adding a MOSFET drain region 40 in one of the COMFET surfaces spaced apart from COMFET gate metal contacts 42. The semiconductor type of the MOSFET drain region is opposite that of the COMFET emitter region (e.g., an N type MOSFET drain region in an N channel COMFET). The MOSFET drain region 40 is electrically shorted to the COMFET anode region 44 so that the monolithic structure has a gate G and source S that are common to both COMFET and MOSFET and separate drain region 40 and anode region 44 that are electrically connected to a drain electrode D. The electrical short may be direct when both drain and anode regions are attached to the same header surface of the COMFET (FIG. 7) or via an electrical conductor 48 when the regions are on opposite sides of the COMFET (FIG. 8).

Figure 9:
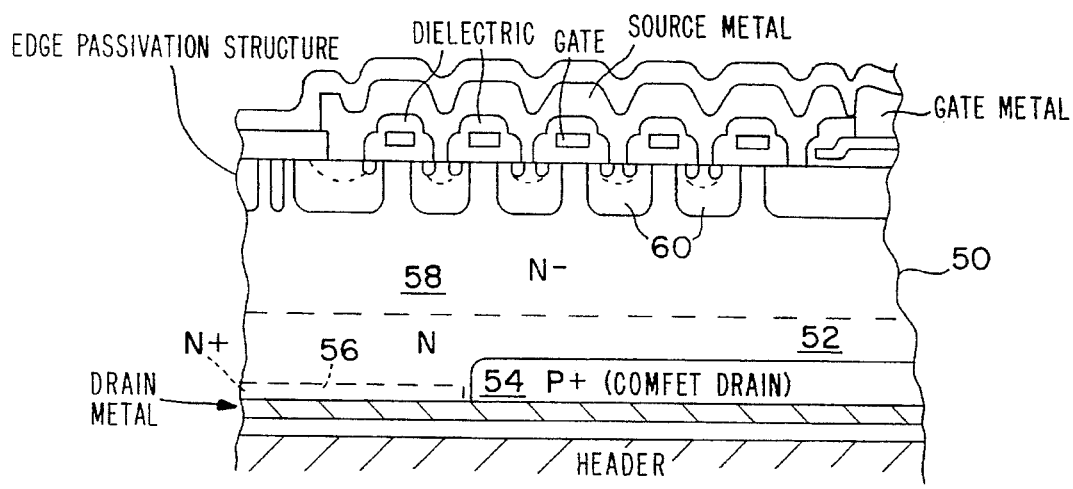
FIG. 9 is a partial pictorial representation of a vertical cross-section of yet a further embodiment of the present invention.
Figure 10:
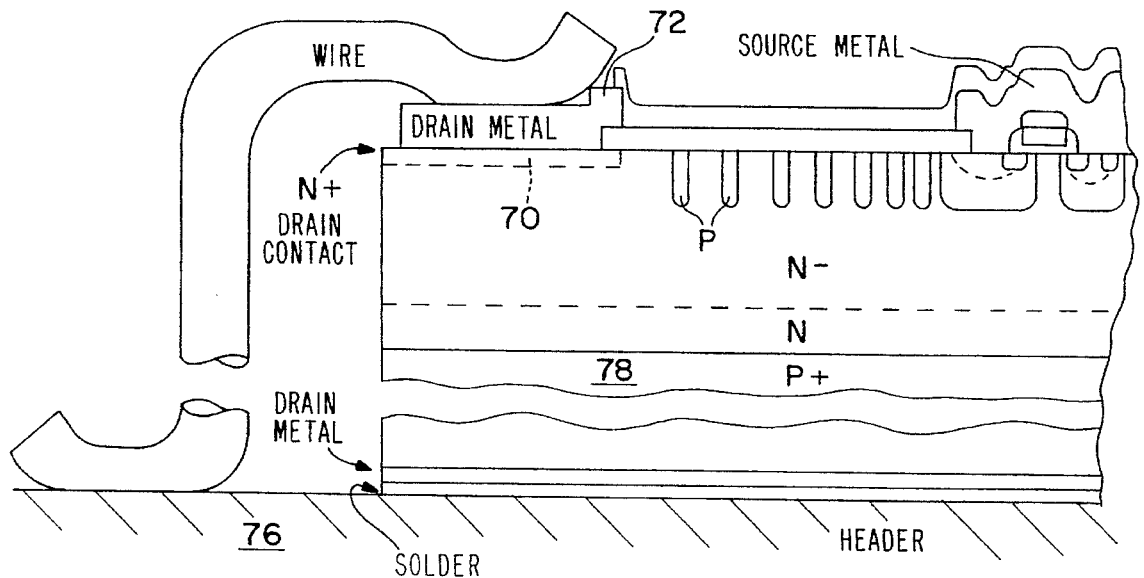
FIG. 10 is a partial pictorial representation of a vertical cross-section of still a further embodiment of the present invention.

With reference now to FIGS. 9 and 10, the monolithic structure of the present invention may be formed by a diffusion process (FIG. 9) or by an epitaxial process (FIG. 10), with the latter process being preferred.

With reference to FIG. 9, the diffusion process begins with a thin wafer 50 having a thickness appropriate to the desired avalanche voltage. A punchthrough barrier 52 may be deposited and diffused into one side of the wafer while the gate structure and body regions as found in typical COMFETs are formed on the opposite side of the wafer. The P+ anode region 54 of the COMFET and the N+ drain region 56 of the MOSFET, are formed on the side with the punchthrough barrier 52. Such a device has excellent electrical and thermal characteristics, but tend to be difficult to manufacture because it is so thin. For example, for a 1000 volt device, the voltage supporting layer 58 may have a thickness of about 80 microns, the punchthrough barrier 52 a thickness of about 3 to 10 microns and the body regions 60 thickness on the order of 2 to 5 microns for a total thickness of less than 4 mils for optimum performance.

With reference now to FIG. 10, in the epitaxial process the wafer manufacturing process is the same as in conventional COMFETs. In contrast to conventional COMFETs, however, the present invention may include a MOSFET drain contact region 70 on the top surface of the chip. Space for the MOSFET drain contact region 70 may be provided at the edge of the chip by increasing the size of the N+ channel stopper around the edge of the chip and by adding a metal contact pad 72. A wire 74 may be added from the contact pad to the header 76 for the device, the header being electrically connected to the anode region 78 of the COMFET. When the chip is large, additional contact points may be added in other areas appropriately located throughout the chip surface.

The monolithic embodiment of the present invention provides several advantages over the discrete chip embodiment. For example, the discontinuity during current direction reversal is reduced because the reverse current will have generated stored charges which are made available to allow forward current to rise more rapidly. Further, the turn-off of the device will be faster because the MOSFET drain contact acts as an internal short on the P emitter junction of the COMFET so that the stored charge can be removed more rapidly during turn-off.

In addition, the latching current is increased by locating the MOSFET drain contact in those regions of the device which are remote from the gate metal contact to the gate. As the COMFET is being turned off, the region nearest the gate metal contacts is turned off first, so that, in effect, the current is pushed away from the gate metal contacts toward the more remote regions. This creates a higher current density and increases the possibility of latch-up in the more remote regions of the chip. By locating the MOSFET drain contact in the remote regions the chip becomes less regenerative, and possibly fully non-regenerative, so that the final turn-off occurs in the MOSFET portion of the device rather than in the COMFET structure, whereby the device can tolerate higher currents before latch-up occurs.

While the devices illustrated herein are N channel devices, it will be appreciated that the invention may be applied to P channel devices as well.

While preferred embodiments of the present invention have been described, it is to be understood that the embodiments described are illustrative only and that the scope of the invention is to be defined solely by the appended claims when accorded the full range of equivalence, with many variations and modifications naturally occurring to those skilled in the art from a perusal hereof.

We claim:

1. A COMFET semiconductor device comprising:
    a first surface of a semiconductor substrate with a COMFET gate and a COMFET source thereon;
    a second surface of the semiconductor device with a COMFET anode region thereon;
    a MOSFET drain region on said first surface;
    said MOSFET drain region being electrically shorted to said anode region through a wire extending from said first surface that electrically connects said MOSFET drain region and a metallic header electrically connected to said COMFET anode region to form a MOSFET in said substrate, said MOSFET having its gate, source and drain regions electrically connected respectively to the gate, source and anode regions of said COMFET.

2. The semiconductor device of claim 1 further comprising a punchthrough barrier adjacent said second surface.

3. The device of claim 1 wherein said surfaces are formed through a diffusion process.

4. The device of claim 2 wherein the device has a peak rating of at least 1,000 volts, and the punchthrough barrier is from about 3 microns to about 10 microns in thickness.

5. The device of claim 4 further comprising a voltage blocking region having a depth of from about 70 microns to about 90 microns.

6. The device of claim 1 wherein said drain contact region and the source regions have an N-type conductivity and said anode region has a P-type conductivity.

7. The device of claim 1 wherein said surfaces are formed through an epitaxial process.

8. The device of claim 1 wherein the device has a peak rating of at least 1,000 volts, and the anode region has a depth of about 500 microns.

9. An electrical switch circuit comprising:
    a COMFET having source and gate electrodes on a first surface of a wafer of semiconductor material, and an anode on a second surface of said wafer;
    a MOSFET having source and gate electrodes on said first surface of said wafer and a drain on said second surface, said MOSFET being electrically connected to said COMFET substantially in parallel so that the sources of the MOSFET and the COMFET are common and the anode of the COMFET and the drain of the MOSFET are common; and
    a gate control circuit for selectively applying an electrical signal to the gate electrodes of the COMFET and the MOSFET,
    whereby upon turning on the switch circuit and application of a voltage potential between the source and the anode and drain electrodes, initially substantially all of the current in the circuit is through the MOSFET and subsequently substantially through the COMFET.

10. The circuit of claim 9 wherein said surfaces are formed through a diffusion process.

11. The circuit of claim 9 wherein said wafer further comprises a punchthrough barrier adjacent said second surface.

12. The circuit of claim 11 wherein the circuit has a peak rating of at least 1,000 volts, and said punchthrough barrier is from about 3 microns to about 10 microns in thickness.

13. The circuit of claim 12 further comprising a voltage blocking region having a depth of from about 70 microns to about 90 microns.

14. The circuit of claim 9 wherein said MOSFET drain and said source regions have an N-type conductivity and said COMFET anode has a P-type conductivity.

15. The circuit of claim 9 wherein said surfaces are formed through an epitaxial process.

16. The circuit of claim 9 wherein the circuit has a peak rating of at least 1,000 volts, and said COMFET anode has a depth of about 500 microns.

* * * * *